United States Patent
Sasao

(10) Patent No.: US 10,027,228 B2
(45) Date of Patent: Jul. 17, 2018

(54) SWITCHING CONVERTER HAVING NOISE CANCELLATION FEATURE AND ELECTRONIC DEVICE USING THE SAME

(71) Applicant: Sony Interactive Entertainment Inc., Tokyo (JP)

(72) Inventor: Kazuki Sasao, Tokyo (JP)

(73) Assignee: Sony Interactive Entertainment Inc., Tokyo (JP)

(*) Notice: Subject to any disclaimer, the term of this patent is extended or adjusted under 35 U.S.C. 154(b) by 0 days.

(21) Appl. No.: 15/311,316

(22) PCT Filed: Feb. 25, 2015

(86) PCT No.: PCT/JP2015/055415
§ 371 (c)(1),
(2) Date: Nov. 15, 2016

(87) PCT Pub. No.: WO2015/182192
PCT Pub. Date: Dec. 3, 2015

(65) Prior Publication Data
US 2017/0093285 A1  Mar. 30, 2017

(30) Foreign Application Priority Data
May 29, 2014  (JP) ................. 2014-111670

(51) Int. Cl.
| | | |
|---|---|---|
| *H02M 3/158* | (2006.01) | |
| *H02M 1/44* | (2007.01) | |
| *H02M 7/00* | (2006.01) | |

(52) U.S. Cl.
CPC ............ *H02M 3/158* (2013.01); *H02M 1/44* (2013.01); *H02M 7/003* (2013.01)

(58) Field of Classification Search
CPC ......... H02M 1/44; H02M 7/003; H02M 3/158
See application file for complete search history.

(56) References Cited

U.S. PATENT DOCUMENTS

| | | |
|---|---|---|
| 8,811,027 B2 | 8/2014 | Kato |
| 8,823,345 B2 | 9/2014 | Shtargot |
| | (Continued) | |

FOREIGN PATENT DOCUMENTS

| | | |
|---|---|---|
| JP | 2009177998 A | 8/2009 |
| JP | 2011259622 A | 12/2011 |
| | (Continued) | |

OTHER PUBLICATIONS

International Searc Report for corresponding PCT Application No. PCT/JP2015/055415, 4 pages, dated May 19, 2015.

(Continued)

*Primary Examiner* — Harry Behm
(74) *Attorney, Agent, or Firm* — Matthew B. Dernier, Esq.

(57) ABSTRACT

An input smoothing circuit is provided between an input line and a ground line. A high-side transistor and a low-side transistor are provided in series between the two ends of the input smoothing circuit. The high-side transistor and the low-side transistor are arranged side by side in a first direction on a circuit board. Two current loops that run through the smoothing circuit, the high-side transistor, and the low-side transistor are formed to be substantially linearly symmetrical with respect to an axis of symmetry that extends in the first direction.

6 Claims, 18 Drawing Sheets

(56) References Cited

U.S. PATENT DOCUMENTS

| | | | |
|---|---|---|---|
| 9,088,202 | B2 | 7/2015 | Mizutani |
| 2011/0148370 | A1 | 6/2011 | Mizutani |
| 2013/0049730 | A1 | 2/2013 | Kato |
| 2014/0066834 | A1 | 3/2014 | Oshima |
| 2014/0111174 | A1 | 4/2014 | Shtargot |
| 2014/0117495 | A1* | 5/2014 | Li .......................... H01L 25/50 257/531 |
| 2014/0183550 | A1* | 7/2014 | Reusch ............... H05K 1/0231 257/76 |

FOREIGN PATENT DOCUMENTS

| | | |
|---|---|---|
| JP | 2013046509 A | 3/2013 |
| JP | 2014053742 A | 3/2014 |
| JP | 2014087252 A | 5/2014 |
| WO | 2010029917 A1 | 3/2010 |
| WO | 2013037989 A1 | 3/2013 |

OTHER PUBLICATIONS

International Preliminary Report and Written Search Report for corresponding PCT Application No. PCT/JP2015/055415, 15 pages, dated Dec. 8, 2016.

European Search Report for corresponding EP Application No. 15798727.2, 9 pages, dated Dec. 11, 2017.

* cited by examiner

F I G. 6
(a)
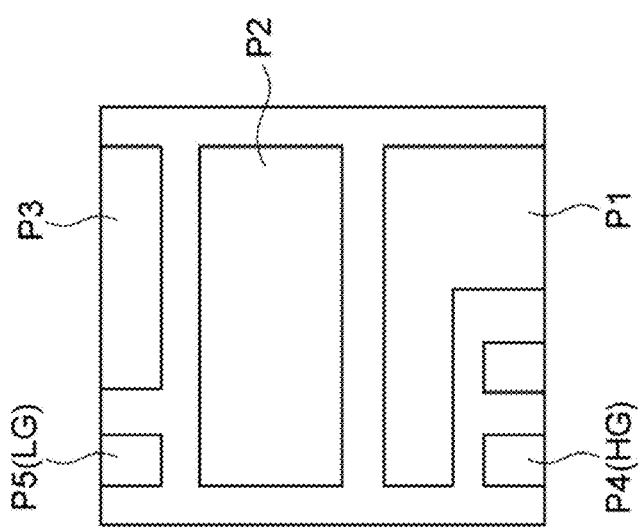
(b)
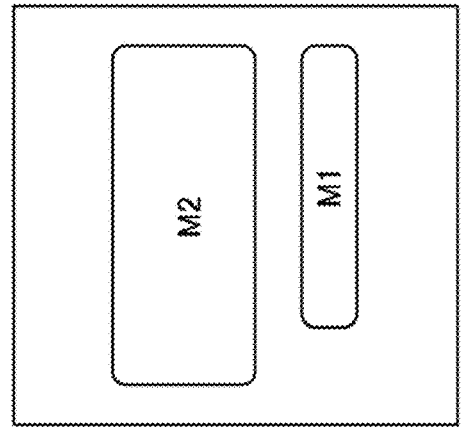

FIG. 10
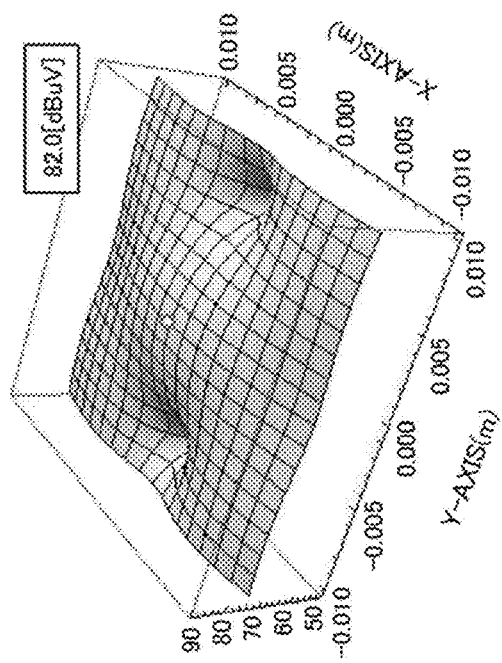
(b)
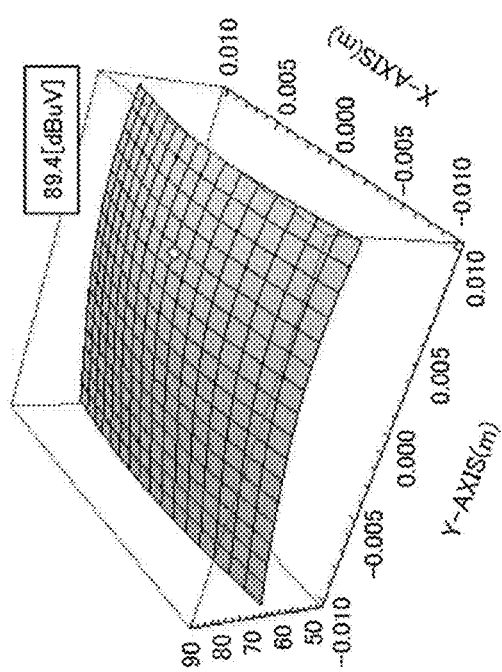
(a) Simulation@10mm $|B| = \sqrt{B_x^2 + B_y^2 + B_z^2}$ FIG. 14
(a)
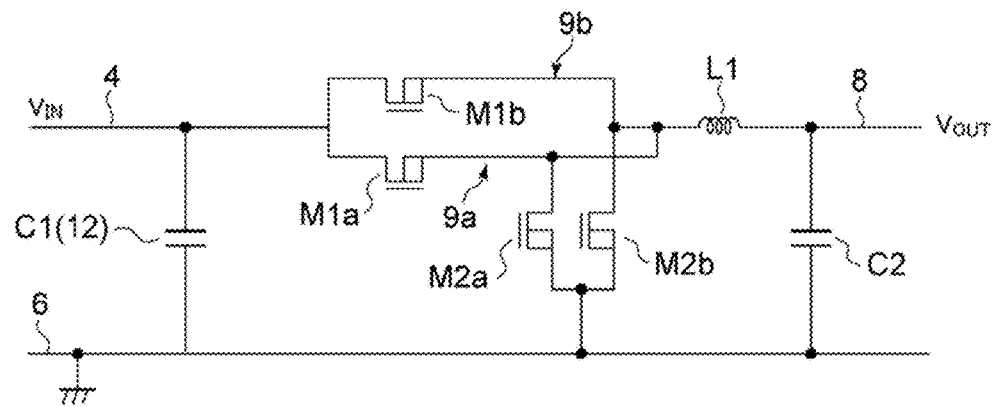
(b)
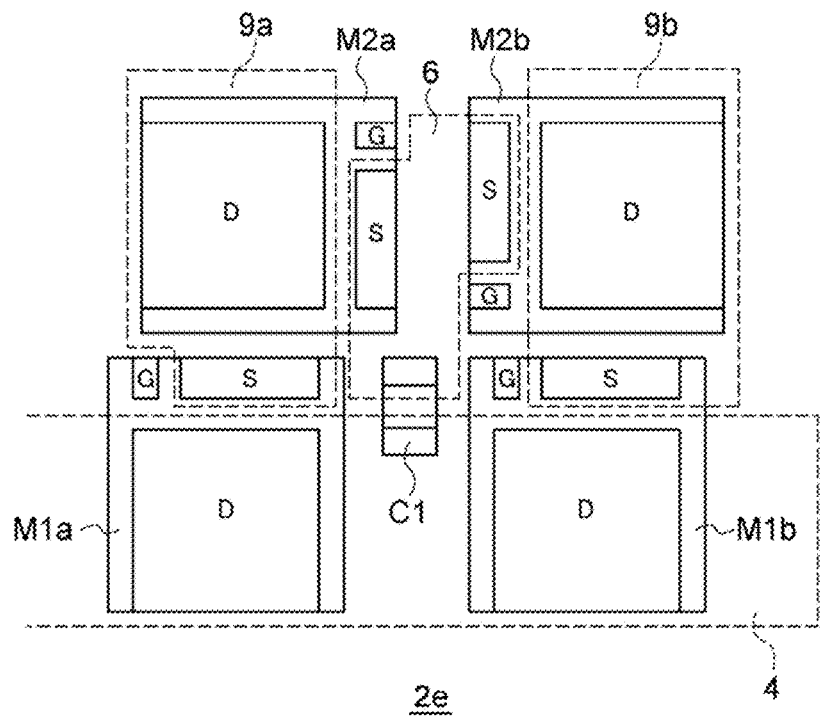

FIG. 15
(a)
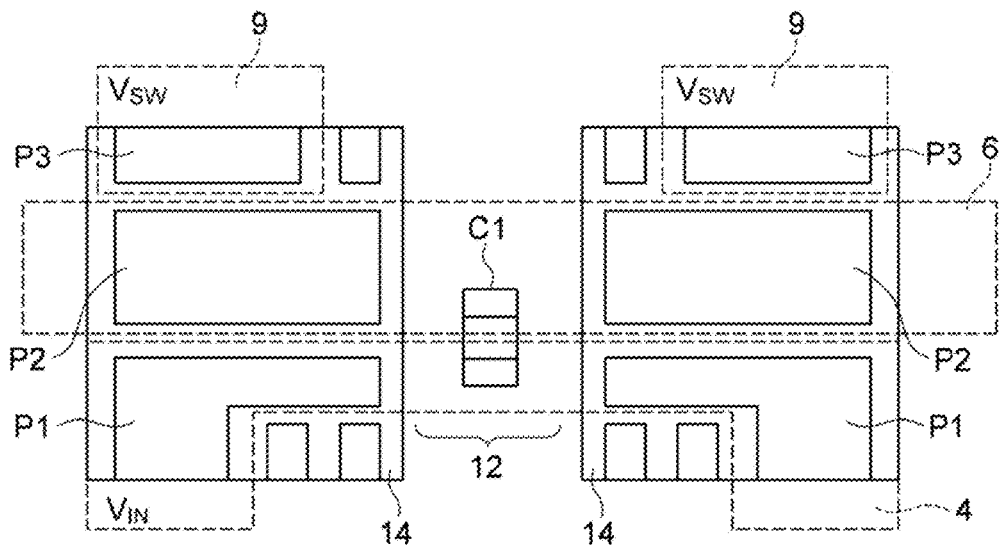
(b)
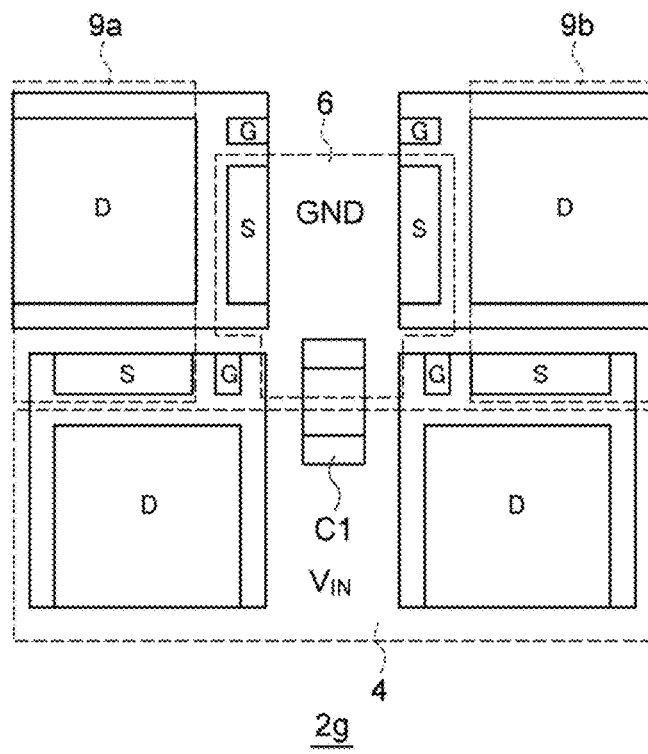

F I G . 1 7
(a)
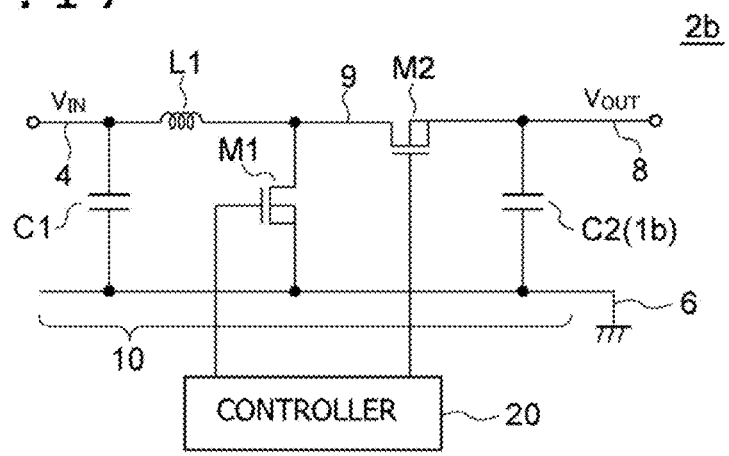
(b)
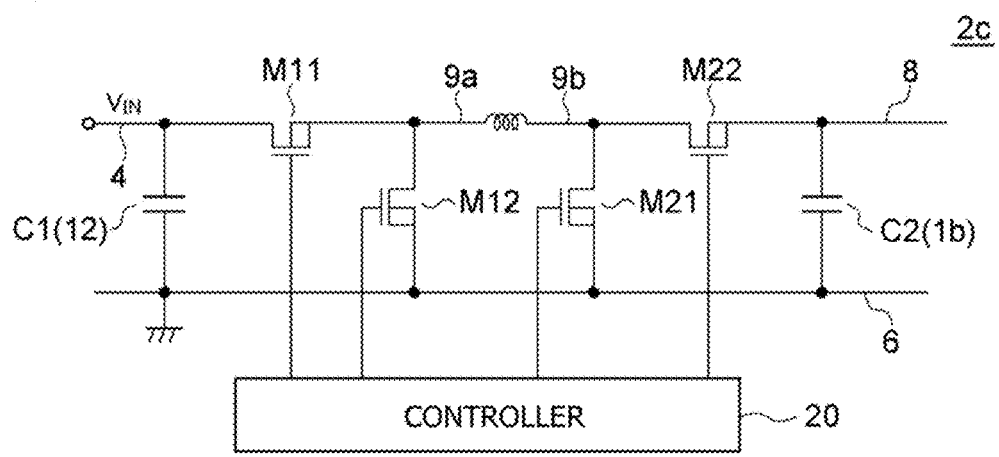
(c)
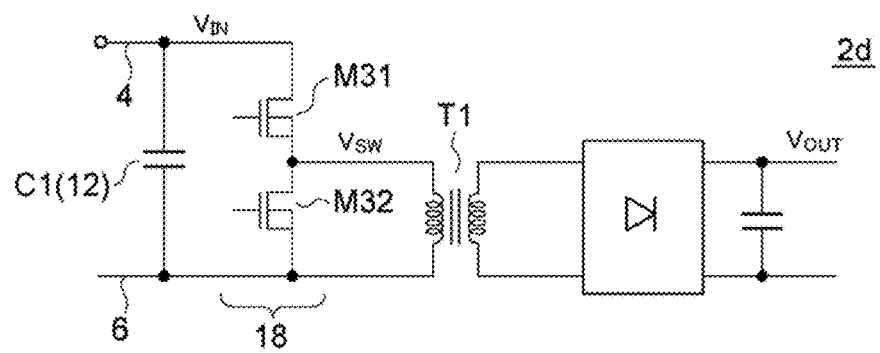

SWITCHING CONVERTER HAVING NOISE CANCELLATION FEATURE AND ELECTRONIC DEVICE USING THE SAME

TECHNICAL FIELD

The present invention relates to a switching converter having switching elements.

BACKGROUND ART

In electronic devices such as personal computers and game consoles, various switching converters are used. Among popular switching converters are DC/DC converters (switching regulators) and AC/DC converters. DC/DC converters are designed to step down a direct current (DC) voltage supplied from a battery or inverter to an optimal voltage level for load. AC/DC converters are designed to convert an alternating current (AC) voltage into a corresponding DC voltage.

FIG. 1 is a circuit diagram illustrating a configuration example of a switching converter 2r studied by the present inventors. The switching converter 2r illustrated in FIG. 1 is a step-down DC/DC converter and primarily includes an output circuit 10 and a control circuit (controller) 20.

The switching converter 2r steps down an input voltage $V_{IN}$ of an input line 4 to a given level, supplying an output voltage $V_{OUT}$ to a load (not shown) connected to an output line 8.

The output circuit 10 includes an input capacitor C1, an output capacitor C2, a high-side transistor (switching transistor) M1, a low-side transistor (synchronous rectification transistor) M2, and an inductor L1.

The input capacitor C1 is provided between the input line 4 and a ground line 6 to stabilize the input voltage $V_{IN}$. The output capacitor C2 is connected between the output line 8 and the ground line 6 to smooth the output voltage $V_{OUT}$.

The high-side transistor M1 and the low-side transistor M2 are connected in series between the input line 4 and the ground line 6, i.e., in parallel with the input capacitor C1. The inductor L1 is provided between a switching node (or also referred to as a switching line) 9 and the output line 8. The switching node is a connection point between the high-side transistor M1 and the low-side transistor M2.

The controller 20 is supplied with a feedback voltage $V_{FB}$ that is proportional to the output voltage $V_{OUT}$. The controller 20 generates a pulse signal whose duty ratio is adjusted so that the feedback voltage $V_{FB}$ approaches a given reference voltage $V_{REF}$. The controller 20 generates a gate voltage HG for the high-side transistor M1 and a gate voltage LG for the low-side transistor M2 in accordance with the pulse signal, complementarily switching between the high-side transistor M1 and the low-side transistor M2 with a dead time provided between the switching events. Switching between the high-side transistor M1 and the low-side transistor M2 is controlled by the controller 20, stabilizing the output voltage $V_{OUT}$ to a target level.

CITATION LIST

Patent Literature

[PTL 1] JP 2009-177998 A

SUMMARY

Technical Problem

The present inventor has recognized the following problem as a result of study of the switching converter 2r illustrated in FIG. 1.

FIG. 2 is an operation waveform diagram of the switching converter 2r illustrated in FIG. 1. FIG. 2 shows the input voltage $V_{IN}$ and a voltage (referred to as a switching voltage) $V_{SW}$ of the switching node 9. Prior to time t0, the gate voltages HG and LG are at low and high levels, respectively, with the high-side transistor M1 and the low-side transistor M2 being OFF and ON, respectively. The switching voltage $V_{SW}$ is at a ground voltage ($V_{GND}$=0 V).

At time t0, the gate voltage HG of the high-side transistor M1 goes up to high level, and the gate voltage LG of the low-side transistor M2 goes down to low level. At time t1, a given transition time later, and beyond, the high-side transistor M1 turns fully ON and remains ON, and the low-side transistor M2 turns OFF, causing the switching voltage $V_{SW}$ to be substantially equal to the input voltage $V_{IN}$. It should be noted that, in an actual DC/DC converter, switching between the high-side transistor M1 and the low-side transistor M2 is controlled in such a manner that a dead time is provided between the switching events. However, such a dead time is ignored here.

The switching converter 2r illustrated in FIG. 1 has a current loop that includes the input capacitor C1, the output capacitor C2, the high-side transistor M1, and the low-side transistor M2. During the transition time from t0 to t1, a current including high-frequency components resulting from switching between the high-side transistor M1 and the low-side transistor M2 flows into the current loop including the input capacitor C1, the high-side transistor M1, and the low-side transistor M2, thus resulting in ringing of the input voltage $V_{IN}$ and the switching voltage $V_{SW}$. Although dependent on the resonance frequency of the resonance circuit including the inductor L1, the ringing frequency is often about several tens to hundreds of MHz, for example.

Power noise associated with this high-frequency ringing adversely affects other electronic devices as electromagnetic interference (EMI). Therefore, designers of electronic devices end up spending enormous amounts of time in combating EMI. For example, it has been common to cover the noise source of the DC/DC converter with metallic plates. However, this hinders downsizing of electronic devices and also leads to higher cost.

The present invention has been devised in light of the foregoing, and it is an illustrative object of a mode of the present invention to provide a switching converter that contributes to reduce EMI.

Solution to Problem

A mode of the present invention relates to a switching converter. The switching converter includes a smoothing circuit and first and second transistors. The smoothing circuit includes at least one capacitor. The first and second transistors are connected in series between two ends of the smoothing circuit. The first and second transistors are arranged side by side in a first direction on a circuit board. Two current loops that run through the smoothing circuit and the first and second transistors are formed to be substantially linearly symmetrical with respect to an axis of symmetry that extends in the first direction.

By designing an element layout and a wiring pattern so that a current flowing through the smoothing circuit and the first and second transistors branches into two current loops and so that the two current loops are substantially linearly symmetrical, it is possible to cause the magnetic fluxes, induced by the two current loops, to cancel each other out, thus contributing to reduce EMI.

Another mode of the present invention relates to an electronic device. The electronic device includes one of the above switching converters.

It should be noted that any combinations of the above components and any conversions of expressions of the present invention between method, device, system, and so on are also effective as modes of the present invention.

Advantageous Effect of Invention

The present invention contributes to reduce EMI of switching converters.

BRIEF DESCRIPTION OF DRAWINGS

FIG. 6(*a*) is a diagram illustrating a pin assignment of a power module, and FIG. 6(*b*) is a diagram illustrating an internal layout thereof.

FIGS. 10(*a*) and 10(*b*) are diagrams illustrating calculation results of magnetic fields near the switching converters illustrated respectively in FIGS. 8 and 7.

FIGS. 14(*a*) and 14(*b*) are, respectively, a circuit diagram and a layout diagram of a switching converter according to a first modification example.

FIGS. 15(*a*) and 15(*b*) are layout diagrams of switching converters according to a second modification example.

FIGS. 17(*a*) to 17(*c*) are circuit diagrams of modification examples of switching converters.

DESCRIPTION OF EMBODIMENTS

Figure 1:
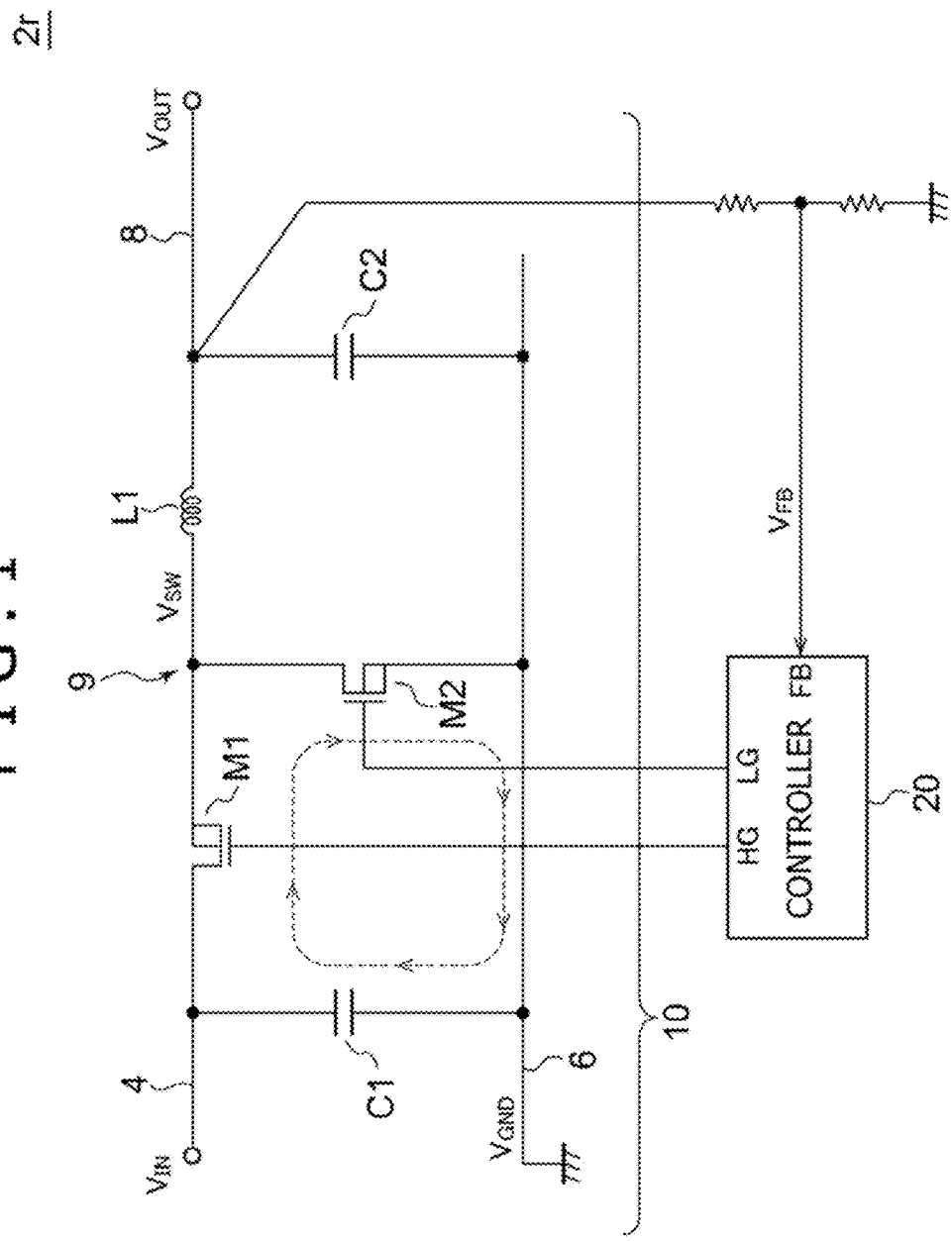
FIG. 1 is a circuit diagram illustrating a configuration example of a switching converter studied by the present inventor et al.
Figure 2:
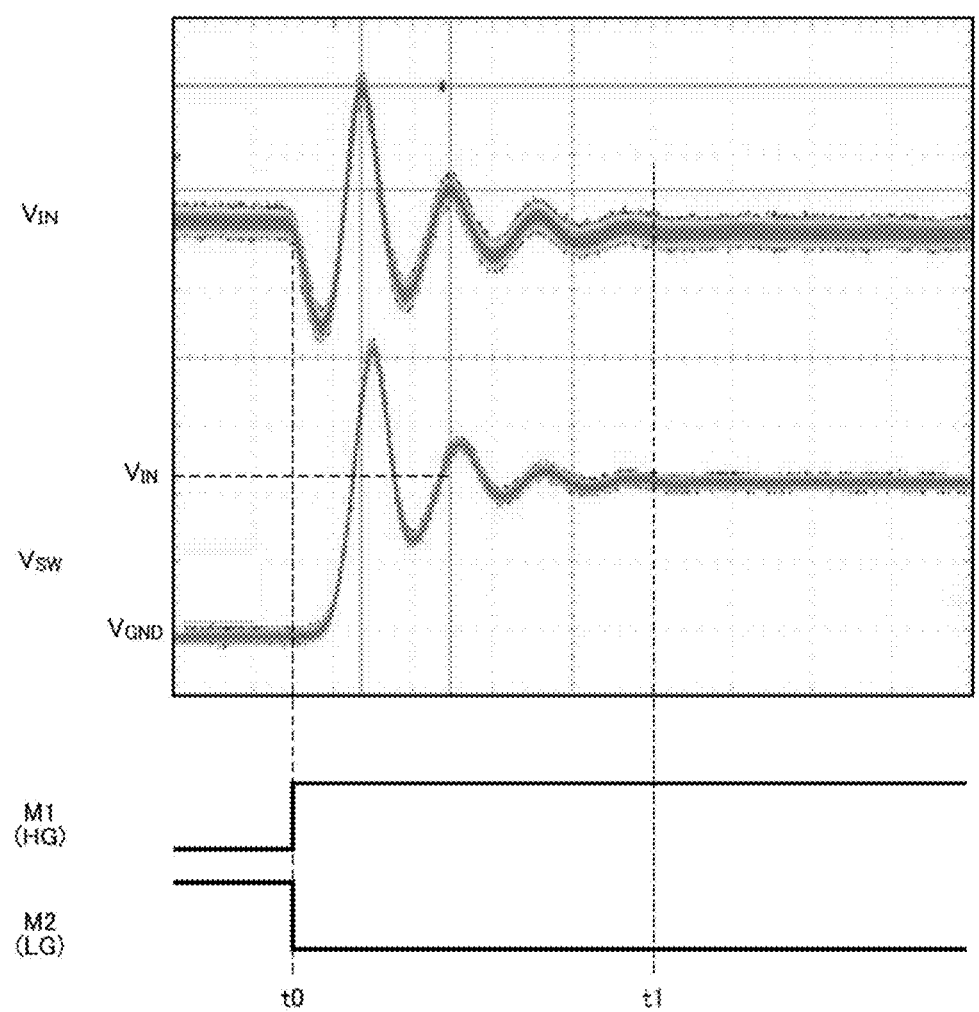
FIG. 2 is an operation waveform diagram of the switching converter illustrated in FIG. 1.

A description will be given below of preferred embodiments of the present invention with reference to the accompanying drawings. The same or like components, members, and steps shown in each drawing will be denoted by the same reference numerals, and the description thereof will be omitted as appropriate. Further, the embodiments are not intended to be limiting but illustrative of the invention. All the features and combinations described in the embodiments are not necessarily essential to the invention.

In the present specification, the expression "the condition in which a member A is connected to a member B" includes not only physical and direct connection of the member A to the member B but also indirect connection of the members A and B via other member that does not affect the electrical connection condition.

Similarly, the expression "the condition in which a member C is provided between the members A and B" includes not only direct connection of the members A and C or the members B and C but also indirect connection of the members A and C or the members B and C via other member that does not affect the electrical connection condition.

First Embodiment

Figure 3:
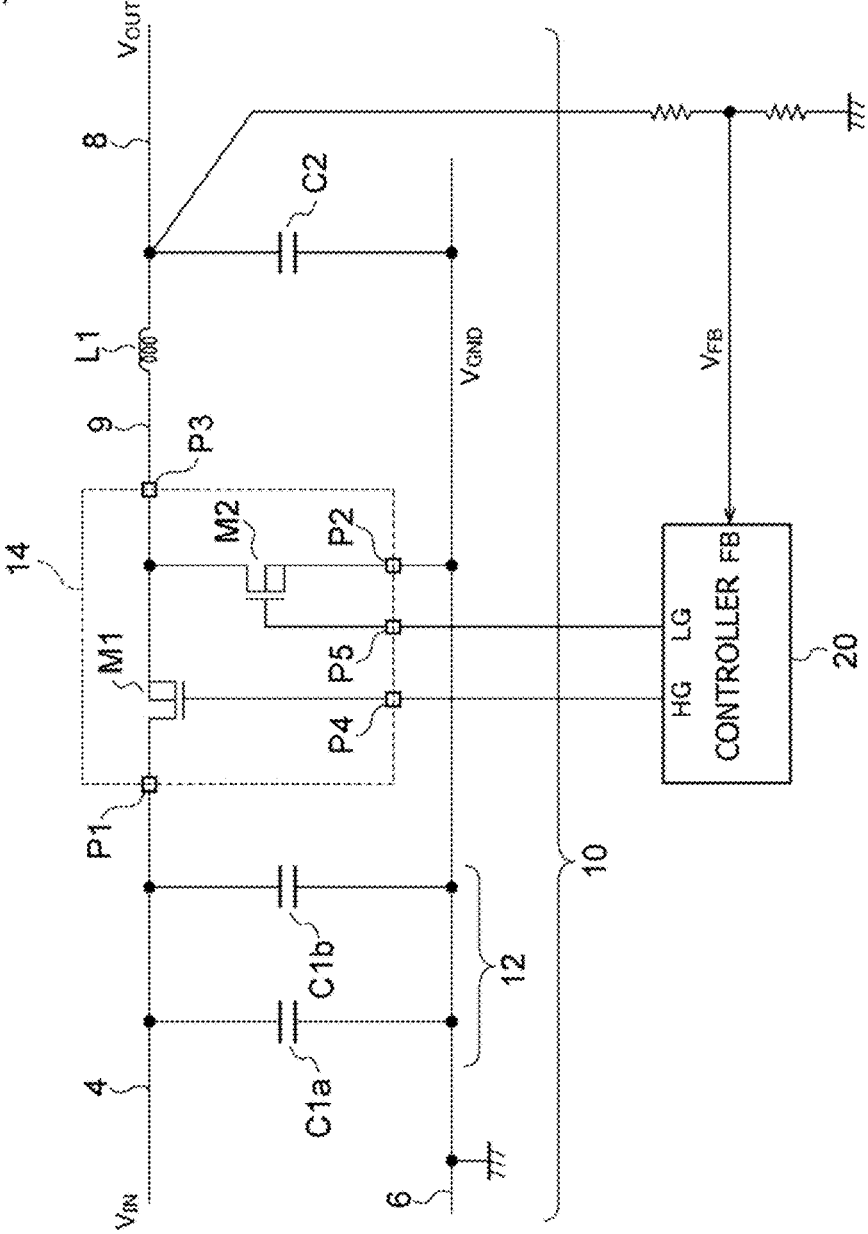
FIG. 3 is a circuit diagram of a switching converter according to a first embodiment.

FIG. 3 is a circuit diagram of a switching converter 2 according to a first embodiment. The switching converter 2 is similar in basic configuration to its counterpart shown in FIG. 1. In the present embodiment, an even number of input capacitors such as two input capacitors C1*a* and C1*b* are connected in parallel between the input line 4 and the ground line 6. The input capacitors C1*a* and C1*b* are referred to as an input smoothing circuit 12.

The high-side transistor (first transistor) M1 and the low-side transistor (second transistor) M2 may be packaged in a single power module 14 as illustrated in FIG. 3. The power module 14 includes a drain terminal P1, a source terminal P2, a switching terminal P3, and a first gate terminal P4, and a second gate terminal P5. The drain terminal P1 is connected to one end (drain) of the high-side transistor M1. The source terminal P2 is connected to one end (source) of the low-side transistor M2. The switching terminal P3 is connected to a switching terminal, a connection node between the high-side transistor M1 and the low-side transistor M2.

The drain terminal P1 is connected to the input line 4. The source terminal P2 is connected to the ground line 6. The switching terminal P3 is connected to the inductor L1 via a switching line 9. Gate drive voltages HG and LG from the controller 20 are fed to the first and second gate terminals P4 and P5, respectively. It should be noted that although, in the present embodiment, a case is shown in which the high-side transistor M1 and the low-side transistor M2 are both N-channel MOSFETs, the high-side transistor M1 may be a P-channel MOSFET. Alternatively, an insulated gate bipolar transistor (IGBT) or a bipolar transistor may be used rather than a MOSFET.

Figure 4:
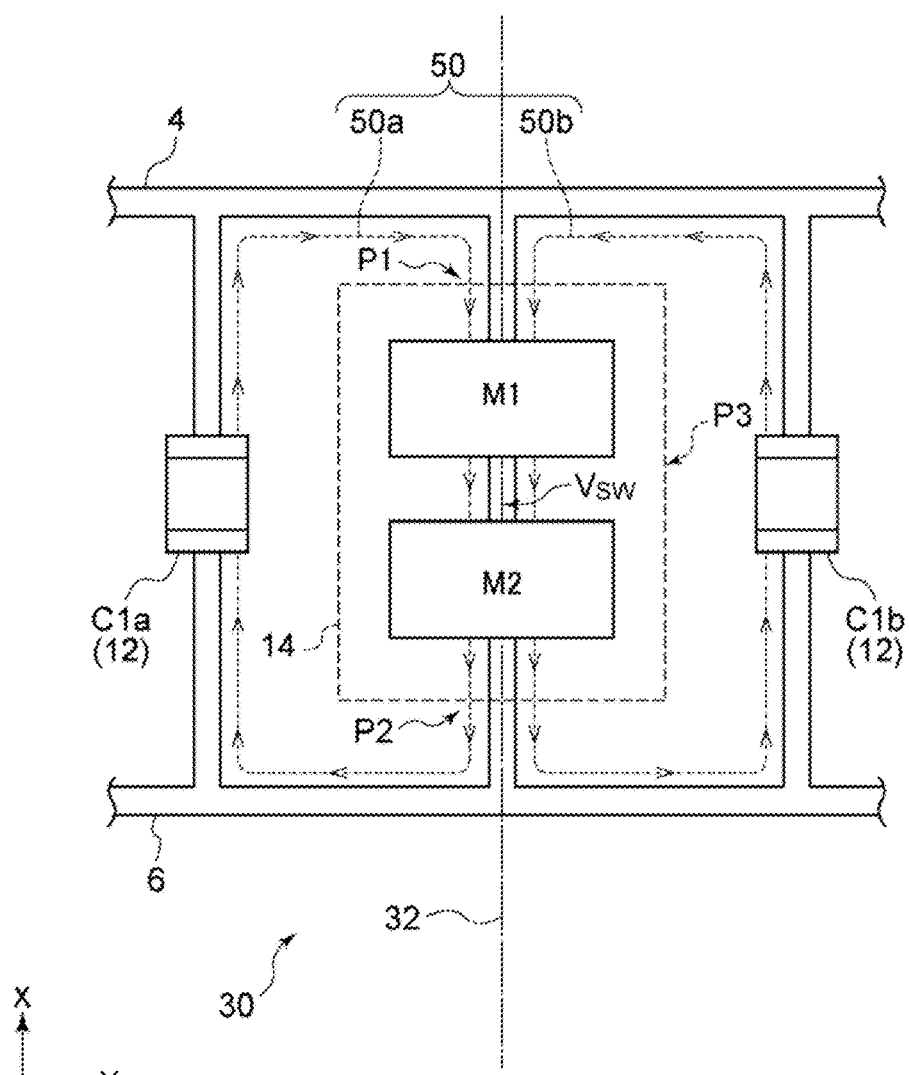
FIG. 4 is a basic layout diagram of the switching converter illustrated in FIG. 3.

FIG. 4 is a basic layout diagram of the switching converter 2 illustrated in FIG. 3. It should be noted that only part of the output circuit 10 of the switching converter 2 is shown here for simple description and easy understanding.

The high-side transistor M1 and the low-side transistor M2 are arranged side by side in a first direction (X direction) on a circuit board 30. Then, a current loop 50 that runs through the smoothing circuit 12, the high-side transistor M1, and the low-side transistor M2 branches into two current loops 50*a* and 50*b*. These loops are formed to be substantially linearly symmetrical with respect to an axis of symmetry 32 that extends in the first direction (X direction).

The input line 4 and the ground line 6 are formed as printed circuits on the circuit board 30.

As described above, the input smoothing circuit 12 includes the two capacitors C1a and C1b. The two capacitors C1a and C1b are arranged symmetrically with the mounting area of the high-side transistor M1 and the low-side transistor M2, in other words, the mounting area of the power module 14, provided therebetween. Then, the wiring pattern (layout) of the input line 4 and the ground line 6 is designed so that the first and second current loops 50a and 50b are linearly symmetrical with respect to the axis of symmetry 32. The first current loop 50a runs through the one capacitor C1a, the high-side transistor M1, and the low-side transistor M2. The second current loop 50b runs through the other capacitor C1b, the high-side transistor M1, and the low-side transistor M2.

Figure 5:
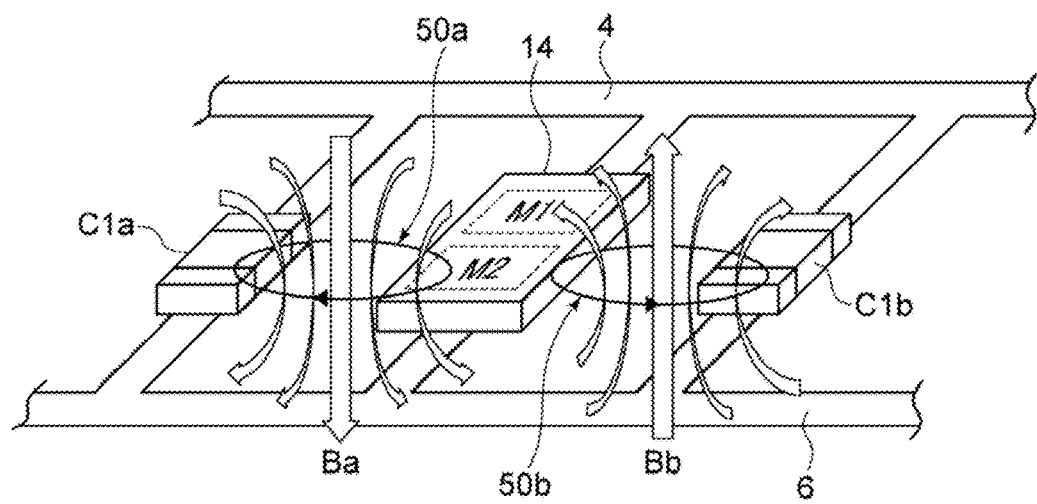
FIG. 5 is a diagram illustrating the operating principle of the switching converter according to the first embodiment.

The basic layout of the switching converter 2 is as described above. Next, a description will be given of the operating principle thereof. FIG. 5 is a diagram illustrating the operating principle of the switching converter 2 according to the first embodiment. Because of the symmetrical layout, currents flow in opposite directions in the first and second current loops 50a and 50b. As a result, magnetic flux densities Ba and Bb induced by the currents flowing through each of the current loops 50a and 50b are opposite in direction.

Therefore, the magnetic flux densities Ba and Bb cancel out at an arbitrary point near the power module 14, thus contributing to reduce electromagnetic noise or EMI as compared to formation of a single current loop.

A description will be given below of a more specific configuration example of the switching converter 2.

FIG. 6(a) is a diagram illustrating a pin assignment of the power module 14, and FIG. 6(b) is a diagram illustrating an internal layout thereof.

As illustrated in FIG. 6(b), the high-side transistor M1 and the low-side transistor M2 are arranged side by side in the first direction (X direction) inside the power module 14. The high-side transistor M1 and the low-side transistor M2 may be integrated in a single die (chip) or may be individually integrated in two separate dies.

Further, the drain terminal P1, the source terminal P2, and the switching terminal P3 are arranged in the first direction (X direction). Among the drain terminal P1, the source terminal P2, and the switching terminal P3, the drain terminal P1 and the source terminal P2 should preferably be arranged adjacent to each other in the first direction. The drain terminal P1 and the source terminal P2 may be interchanged. As the power module 14 having such a layout, for example, asymmetrical dual N-channel MOSFET (FDPC8016S), which is commercially available from Fairchild, can be used.

Figure 7:
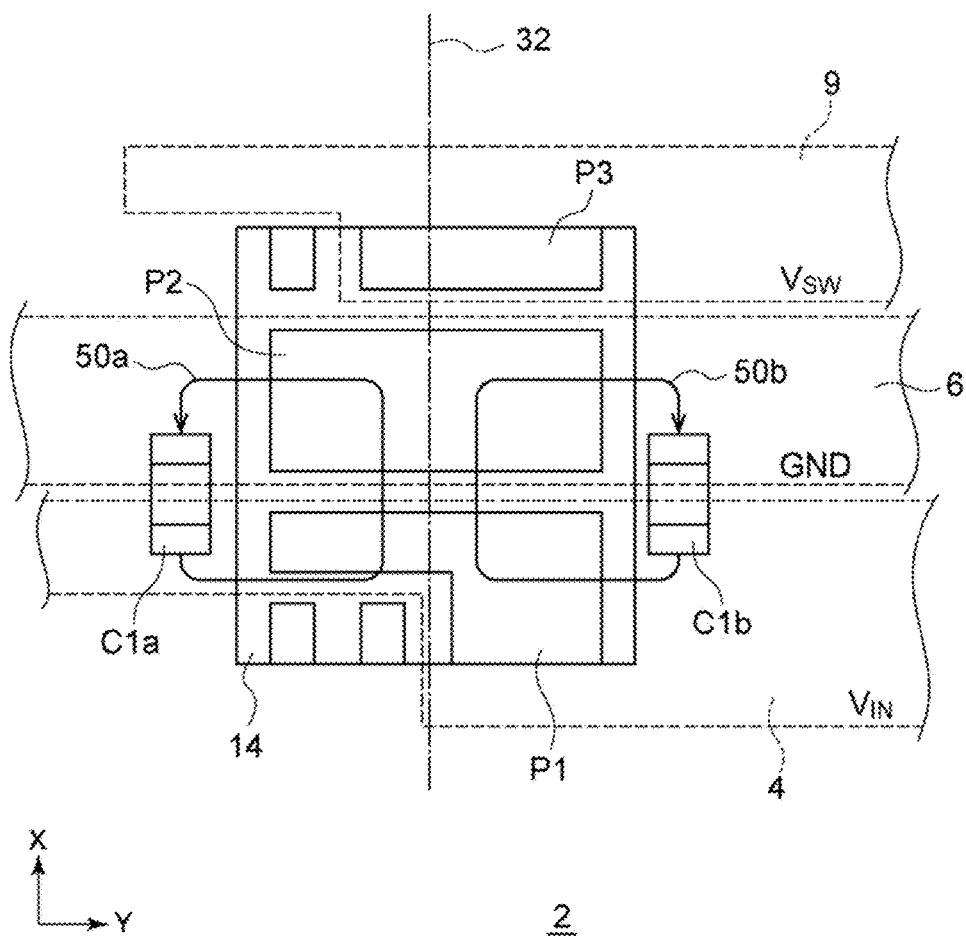
FIG. 7 is a specific layout diagram of the switching converter illustrated in FIG. 3.

FIG. 7 is a specific layout diagram of the switching converter 2 illustrated in FIG. 3. In this layout, the power module 14 having the pin assignment shown in FIG. 6(a) is used. Each of the input line 4 and the ground line 6 has a portion that extends in a second direction (Y direction) perpendicular to the first direction (X direction) near the mounting areas of the input smoothing circuit 12 and the power module 14. More specifically, the input line 4 and the ground line 6 are formed to overlap the drain terminal P1 and the source terminal P2, respectively. The switching line 9 may be formed in parallel with the input line 4 and the ground line 6 in such a manner as to overlap the switching terminal P3.

The input capacitors C1a and C1b are arranged side by side in the Y direction in such a manner as to sandwich the power module 14. One end of each of the input capacitors C1a and C1b is connected to the input line 4, with the other end thereof connected to the ground line 6.

In the layout shown in FIG. 7, the two current loops 50a and 50b are formed that are substantially linearly symmetrical about the axis of symmetry 32. As described with reference to FIG. 5, therefore, the magnetic fluxes generated by the two current loops 50a and 50b cancel each other out, thus contributing to reduce EMI.

Figure 8:
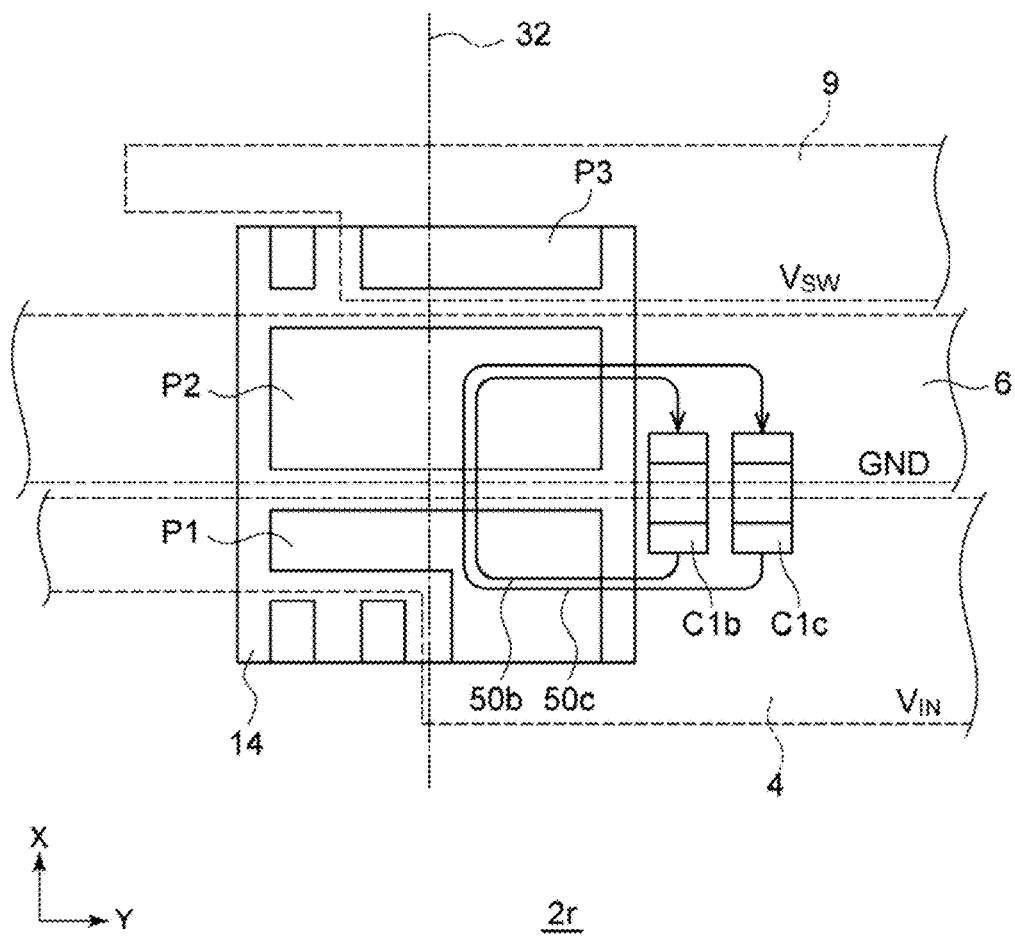
FIG. 8 is a layout diagram of a switching converter according to a comparative technology.

The advantage of the layout shown in FIG. 7 will be apparent by comparison with the layout shown in FIG. 8. FIG. 8 is a layout diagram of the switching converter 2r according to a comparative technology. The input smoothing circuit 12 includes two input capacitors C1b and C1c that are arranged adjacent to each other. In this case, two current loops 50b and 50c are formed to substantially overlap each other and interlink with a common magnetic flux. The current loop 50b runs through the input capacitor C1b and the transistors M1 and M2. The current loop 50c runs through the input capacitor C1c and the transistors M1 and M2. As a result, the magnetic fluxes generated by the current loops 50b and 50c strengthen each other, thus resulting in higher EMI.

Figure 9:
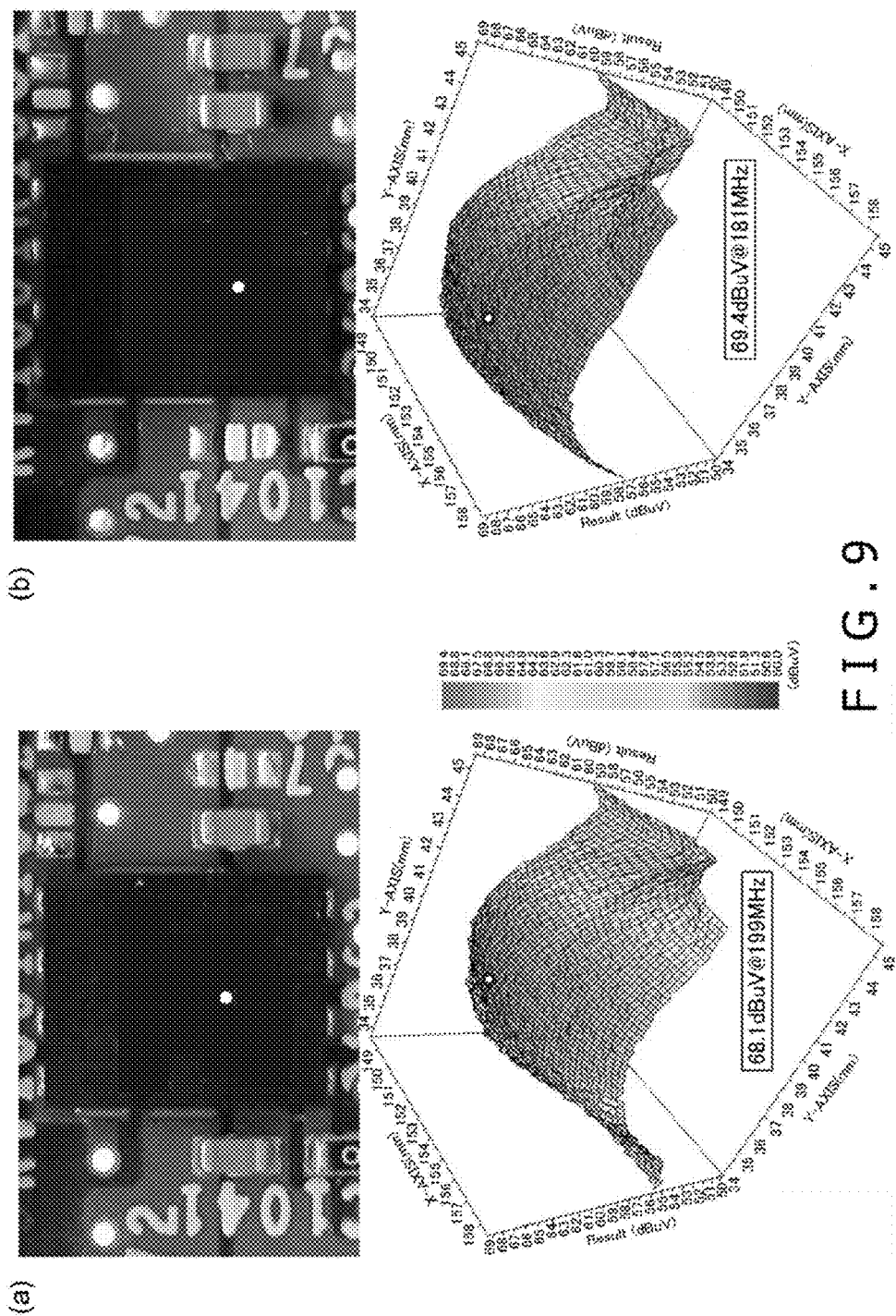
FIGS. 9(*a*) and 9(*b*) are diagrams illustrating measurement results of magnetic fields near the switching converters illustrated respectively in FIGS. 7 and 8.

FIGS. 9(a) and 9(b) are diagrams illustrating measurement results of magnetic fields near the switching converters 2 and 2r illustrated respectively in FIGS. 7 and 8. The magnetic fields were measured 10 mm away from the surface of the power module 14 using a near magnetic field tester (EMI tester: Peritec's EMV-200). In terms of comparison between peak magnetic field strengths, an improvement of about 1.3 dB is observed in the layout shown in FIG. 7 over the layout shown in FIG. 8.

Here, the near magnetic field tester can measure magnetic fluxes Bx and By that are X and Y direction components, respectively, but not a magnetic flux Bz in the direction perpendicular to the paper surface (Z direction). On the other hand, the two current loops are most effective in reducing EMI from the magnetic flux Bz in the Z direction. For this reason, simulation was conducted on the norm |B| of Bx, By, and Bz=$\sqrt{(Bx^2+By^2+Bz^2)}$. FIGS. 10(a) and 10(b) are diagrams illustrating calculation results of magnetic fields near the switching converters 2r and 2 illustrated respectively in FIGS. 8 and 7. The measured points were positioned 10 mm away from the surface of the power module 14. As is clear from the simulation results, an improvement of up to 7.4 dB is observed by arranging the two current loops symmetrically if the magnetic flux Bz in the Z direction is considered.

Figure 11:
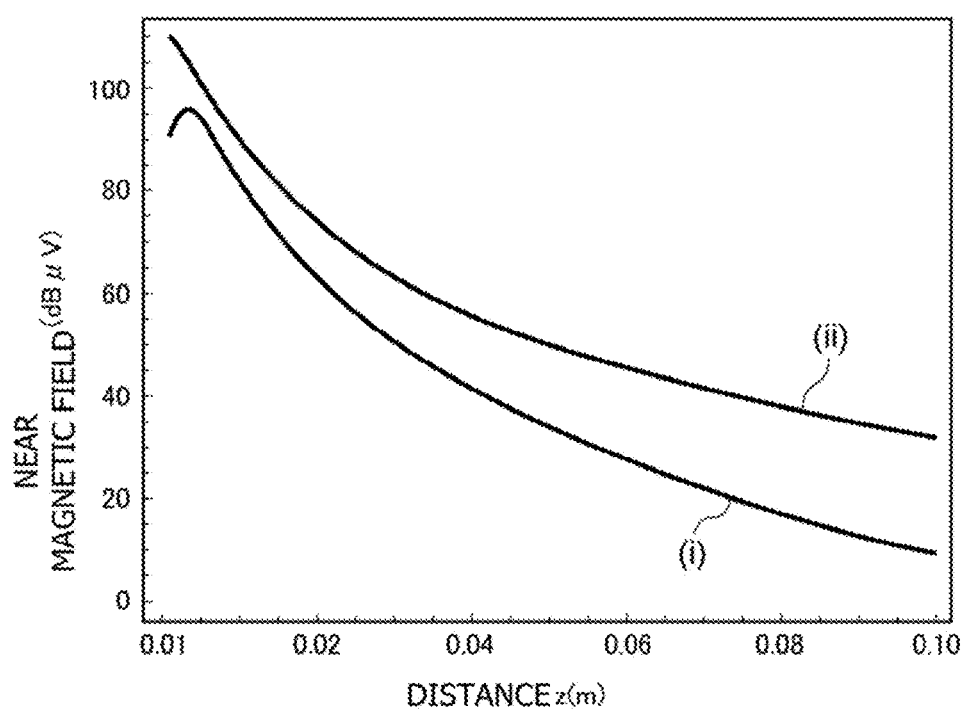
FIG. 11 is a diagram illustrating the relationship between the distance in the Z direction and the magnetic field strength $|B|=\sqrt{(Bx^2+By^2+Bz^2)}$.

FIG. 11 is a diagram illustrating the relationship between the distance in the Z direction and the magnetic field strength |B|=$\sqrt{(Bx^2+By^2+Bz^2)}$. (i) is a curve for the layout shown in FIG. 7, and (ii) for the layout shown in FIG. 8. According to this simulation result, an improvement of 7.4 dB can be observed at a close location where z=1 cm, and an improvement of as much as 22.6 dB can be observed at a far location where z=10 cm.

Thus, in the switching converter 2, a closed loop (current loop) formed by a smoothing circuit and two transistors branches into two loops. The smoothing circuit includes capacitors. The two transistors are connected in series between the two ends of the smoothing circuit. The two loops are laid out in a linearly symmetrical manner. This layout contributes to reduce EMI.

In addition, the following advantage can be obtained by using the power module 14 whose drain terminal P1 and source terminal P2 are arranged adjacent to each other as illustrated in FIG. 6(a) as compared to the layout illustrated in FIG. 4.

In FIG. 4, the drain terminal P1 and the source terminal P2 are not adjacent to each other, with the switching terminal P3 arranged at the center. In this case, the switching line 9 to be connected to the switching terminal P3 must straddle the input line 4 or the ground line 6. In order to do so, it is necessary to form part of wiring on the rear face of the circuit board 30 and connect the switching line 9 to the switching terminal P3 by means of via holes. However, via holes are not preferred because they lead to a difficult-to-predict parasitic inductance.

In contrast, using the power module 14 illustrated in FIG. 6(a) eliminates the need for the switching line 9 to straddle the ground line 6 or the input line 4, thus providing a simple layout.

Further, arranging the drain terminal P1 and the source terminal P2 adjacent to each other contributes to a smaller current loop area, in other words, smaller impedance within the current loop, thus reducing power noise accompanied by high-frequency ringing and cutting down the absolute value of EMI.

Second Embodiment

Figure 12:
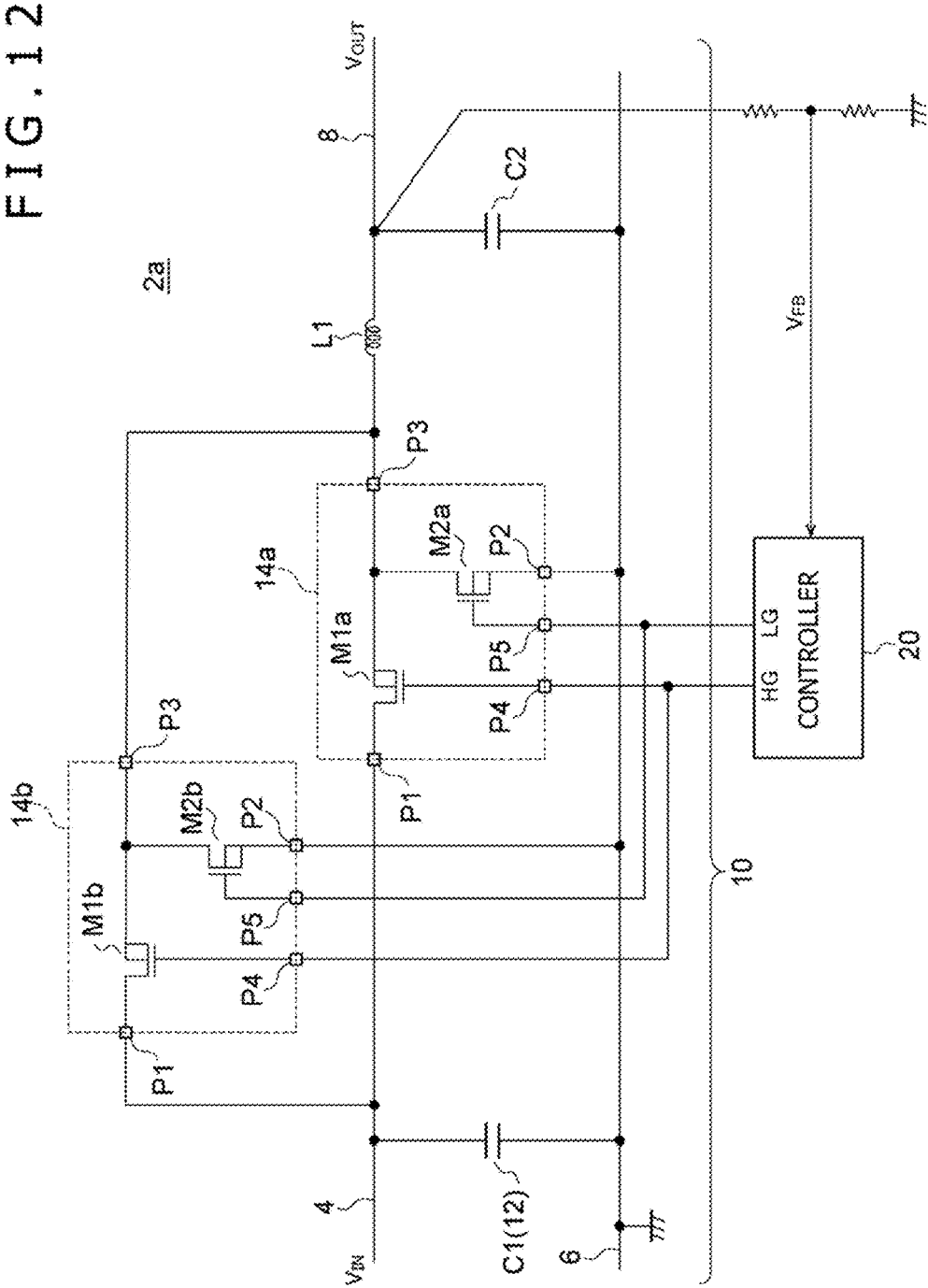
FIG. 12 is a circuit diagram of a switching converter according to a second embodiment.

FIG. 12 is a circuit diagram of a switching converter 2a according to a second embodiment. The switching converter 2a is similar in basic configuration to its counterpart shown in FIG. 3. In the present embodiment, a plurality of N, and specifically an even number of, and more specifically two, power modules 14a and 14b are connected in parallel between the input line 4 and the ground line 6.

The corresponding terminals of the power modules 14a and 14b are connected together. In the equivalent circuit, therefore, the high-side transistor M1 includes two transistors M1a and M1b that are connected in parallel, and the low-side transistor M2 includes two transistors M2a and M2b that are connected in parallel.

Figure 13:
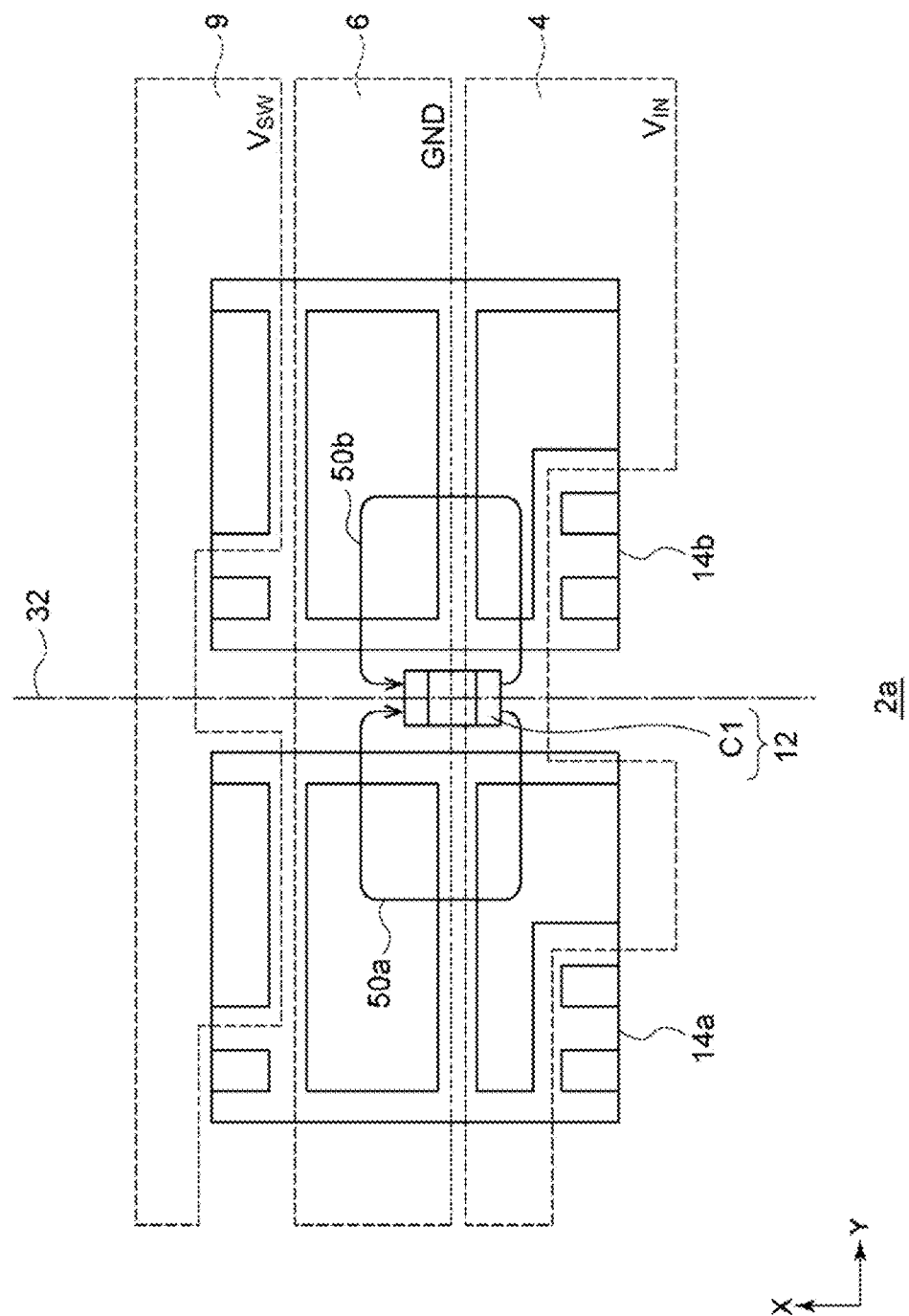
FIG. 13 is a layout diagram of the switching converter illustrated in FIG. 12.

FIG. 13 is a layout diagram of the switching converter 2a illustrated in FIG. 12. In this layout, the input smoothing circuit 12 including the input capacitor C1 is arranged on the axis of symmetry 32, and the two power modules 14a and 14b are arranged to be linearly symmetrical with respect to the axis of symmetry 32 in such a manner as to sandwich the input smoothing circuit 12. The two transistors (not shown) inside the power module 14a are arranged side by side in the X direction. Similarly, the two transistors (not shown) inside the power module 14b are arranged side by side in the X direction. It should be noted that the input smoothing circuit 12 may include the plurality of input capacitors C1 as in FIG. 3. In this case, it is only necessary to arrange the plurality of input capacitors C1 adjacent to each other in the first direction (Y direction).

In the layout shown in FIG. 13, the two current loops 50a and 50b are also formed that are substantially linearly symmetrical about the axis of symmetry 32. As described with reference to FIG. 5, therefore, the magnetic fluxes generated by the two current loops 50a and 50b cancel each other out, thus contributing to reduce EMI.

Thus, the present invention has been described according to several embodiments. It is to be understood by those skilled in the art that these embodiments are illustrative, that the combination of components and processes can be modified in various ways, and that such modification examples also fall within the scope of the present invention. A description will be given below of such modification examples.

(Layout)

In the embodiments, a case has been described in which the high-side transistor (first transistor) M1 and the low-side transistor (second transistor) M2 are packaged in a single power module. However, the present invention is not limited thereto. That is, the high-side transistor M1 and the low-side transistor M2 may be discrete elements that are packaged separately.

First Modification Example

FIGS. 14(a) and 14(b) are, respectively, a circuit diagram and a layout diagram of a switching converter 2e according to a first modification example. On the other hand, the equivalent circuit is similar to that shown in FIG. 12 except that the transistors M1a and M2a of the power module 14a and the transistors M1b and M2b of the power module 14b are separate elements.

Second Modification Example

FIGS. 15(a) and 15(b) are layout diagrams of switching converters 2f and 2g according to a second modification example. The switching converter 2f illustrated in FIG. 15(a) uses the two power modules 14a and 14b whose pin assignments are bilaterally symmetrical in the switching converter 2a illustrated in FIG. 13. Further, the input smoothing circuit 12 includes the input capacitor C1. It should be noted that the input smoothing circuit 12 may include a plurality of input capacitors arranged side by side in the first direction in the present modification example.

The switching converter 2g illustrated in FIG. 15(b) uses the discrete elements M1a and M1b, and M2a and M2b whose pin assignments are bilaterally symmetrical in the switching converter 2e illustrated in FIG. 14(b).

In the modification examples illustrated in FIGS. 15(a) and 15(b), using the elements with bilaterally symmetrical pin assignments provides further enhanced symmetry between the two current loops, thus contributing to further reduced EMI.

In addition, having bilaterally symmetrical pin assignments contributes to an even smaller current loop area, in other words, smaller impedance within the current loops, thus reducing power noise accompanied by high-frequency ringing and cutting down the absolute value of EMI.

Third Modification Example

Figure 16:
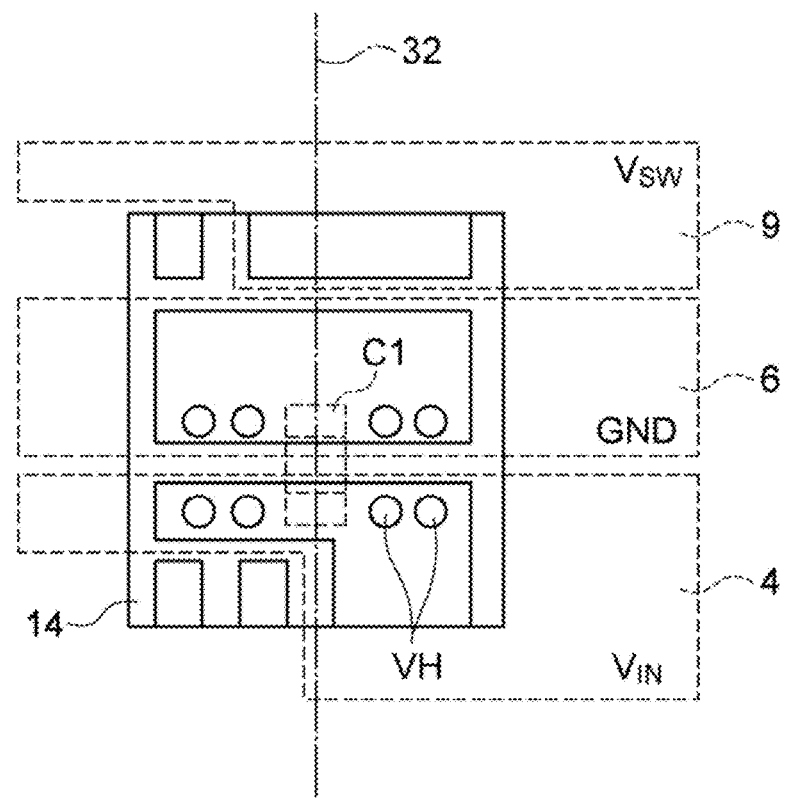
FIG. 16 is a layout diagram of a switching converter according to a third modification example.

FIG. 16 is a layout diagram of a switching converter 2h according to a third modification example.

In the present modification example, the first transistor M1 and the second transistor M2 are arranged side by side on a first face of the circuit board. The input capacitor C1 of the smoothing circuit 12 is arranged on the axis of symmetry 32 on a second face, the rear side of the first face of the circuit board. Wiring on the first and second faces is electrically connected by means of via holes (through holes) VH.

(Switching Converter Model)

In the embodiments, a step-down DC/DC converter has been described as the switching converter 2. However, the present invention is not limited thereto. FIGS. 17(a) to 17(c) are circuit diagrams of modification examples of the switching converter 2. A switching converter 2b illustrated in FIG. 17(a) is a step-up DC/DC converter. In the present topology, the switching transistor (first transistor) M1 and the synchronous rectification transistor (second transistor) M2 are provided in series between the two ends of an output smoothing circuit 16 that includes the output capacitor C2.

Therefore, it is only necessary to lay out the current loop formed by the output smoothing circuit 16 and the transistors M1 and M2 so that the current loop is symmetrical with respect to a given axis of symmetry.

A switching converter 2c illustrated in FIG. 17(b) is a step-up DC/DC converter. The switching converter 2c can be considered a combination of step-down DC/DC converter and step-up DC/DC converter. Therefore, it is possible to provide reduced EMI by forming two current loops in a linearly symmetrical manner, one that runs through the input smoothing circuit 12 and transistors M11 and M12 and another that runs through the output smoothing circuit 16 and transistors M21 and M22.

A switching converter 2d illustrated in FIG. 17(c) is an insulating switching power supply using a transformer. Transistors 31 and 32 form a half-bridge circuit 18. The transistors 31 and 32 of the half-bridge circuit 18 are connected in series between the two ends of the input smoothing circuit 12. Therefore, it is only necessary to lay out the current loop formed by the input smoothing circuit 12 and the transistors M31 and M32 so that the current loop is symmetrical with respect to a given axis of symmetry.

In addition to the above, the present invention is applicable to other switching converters such as three-phase inverter.

(Application)

Figure 18:
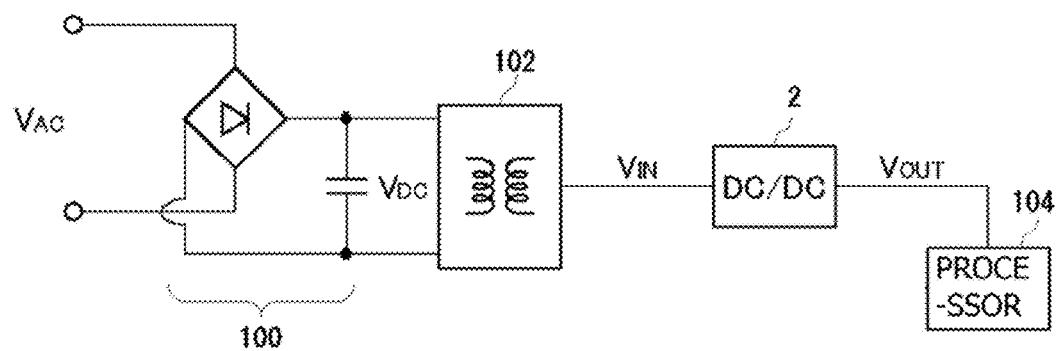
FIG. 18 is a block diagram illustrating a configuration of an electronic device incorporating a switching converter.

Finally, a description will be given of an example of application of the switching converter 2. FIG. 18 is a block diagram illustrating a configuration of an electronic device 1 incorporating the switching converter 2.

The electronic device 1 is, for example, a game console or computer. A rectifying circuit 100 rectifies and smooths a commercial AC voltage $V_{AC}$, thus generating a DC voltage $V_{DC}$. An insulating DC/DC converter 102 steps down the DC voltage $V_{DC}$, thus generating an input voltage $V_{IN}$. The switching converter 2, a DC/DC converter, steps down the input voltage $V_{IN}$, thus supplying an output voltage $V_{OUT}$ to a load such as a power terminal of a processor 104.

Thus, the present invention has been described according to embodiments. It is to be understood by those skilled in the art that the embodiments are illustrative, that the combination of components and processes can be modified in various ways, and that such modification examples also fall within the scope of the present invention.

REFERENCE SIGNS LIST

2 . . . Switching converter, 4 . . . Input line, 6 . . . Ground line, 8 . . . Output line, 9 . . . Switching line, 10 . . . Output circuit, 12 . . . Input smoothing circuit, 14 . . . Power module, 16 . . . Output smoothing circuit, 18 . . . Half-bridge circuit, P1 . . . Drain terminal, P2 . . . Source terminal, P3 . . . Switching terminal, P4 . . . First gate terminal, P5 . . . Second gate terminal, L1 . . . Inductor, C1 . . . Input capacitor, C2 . . . Output capacitor, 20 . . . Controller, M1 . . . High-side transistor, M2 . . . Low-side transistor, 30 . . . Circuit board, 32 . . . Axis of symmetry.

INDUSTRIAL APPLICABILITY

The present invention is applicable to switching converters.

The invention claimed is:

1. A switching converter comprising:
a smoothing circuit that includes at least one capacitor; and
a first transistor and a second transistor connected in series between two ends of the smoothing circuit, wherein
the first and second transistors are arranged side by side in a first direction on a circuit board,
each of the first and second transistors is divided into two portions
a pair of a first portion of the first transistor and a first portion of the second transistor and a pair of a second portion of the first transistor and a second portion of the second transistor are arranged symmetrically with mounting area of the smoothing circuit provided therebetween
the pair of the first portion of the first transistor and the first portion of the second transistor is packaged in one module
the pair of the second portion of the first transistor and the second portion of the second transistor is packaged in another module,
two current loops that run through the smoothing circuit and the first and second transistors are formed to be substantially linearly symmetrical with respect to an axis of symmetry that extends in the first direction, and
the smoothing circuit is arranged on the axis of symmetry.

2. The switching converter of claim 1, wherein
the smoothing circuit includes the 2×M (where M is a natural number) capacitors,
the first and second transistors are arranged on the axis of symmetry, and
the M capacitors and the remaining M capacitors are arranged symmetrically with mounting area of the first and second transistors provided therebetween.

3. The switching converter of claim 1, wherein
the first and second transistors are packaged in a single module,
the module includes:
a drain terminal connected to one end of the first transistor;
a source terminal connected to one end of the second transistor; and
a switching terminal connected to a connection point between the first and second transistors,
the first and second transistors are arranged side by side in a given direction inside the module, and
the drain terminal, the source terminal, and the switching terminal are arranged side by side in the given direction in the order in which the drain terminal and the source terminal are adjacent.

4. The switching converter of claim 1, wherein the one module and the other module have linearly symmetrical pin assignments.

5. The switching converter of claim 1, wherein the first and second transistors are arranged side by side on the axis of symmetry on a first face of the circuit board, and the smoothing circuit is arranged on the axis of symmetry on a second face of the circuit board.

6. An electronic device comprising a switching converter, the switching converter including:
a smoothing circuit that includes at least one capacitor; and
a first transistor and a second transistor connected in series between two ends of the smoothing circuit, wherein
the first and second transistors are arranged side by side in a first direction on a circuit board,
each of the first and second transistors is divided into two portions a pair of a first portion of the first transistor and a first portion of the second transistor and a pair of a second portion of the first transistor and a second portion of the second transistor are arranged symmetrically with mounting area of the smoothing circuit provided therebetween the pair of the first portion of the first transistor and the first portion of the second transistor is packaged in one module the pair of the second portion of the first transistor and the second portion of the second transistor is packaged in another module, two current loops that run through the smoothing circuit and the first and second transistors are formed to be substantially linearly symmetrical with respect to an axis of symmetry that extends in the first direction, and the smoothing circuit is arranged on the axis of symmetry.

* * * * *